(12) United States Patent
Chen

(10) Patent No.: US 7,855,930 B2
(45) Date of Patent: Dec. 21, 2010

(54) POWER-ON MANAGEMENT CIRCUIT FOR MEMORY

(75) Inventor: Chih-Jen Chen, Taoyuan County (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 93 days.

(21) Appl. No.: 12/420,132

(22) Filed: Apr. 8, 2009

(65) Prior Publication Data

US 2010/0202234 A1 Aug. 12, 2010

(30) Foreign Application Priority Data

Feb. 10, 2009 (TW) .............................. 98104253 A

(51) Int. Cl.
*G11C 5/14* (2006.01)
(52) U.S. Cl. .................. 365/226; 365/194; 365/241; 365/191; 365/227; 365/189.08
(58) Field of Classification Search .................. 365/226, 365/194, 241, 191, 227, 189.08, 210.12
See application file for complete search history.

(56) References Cited

U.S. PATENT DOCUMENTS 6,768,354 B2 * 7/2004 Yamazaki et al. ........... 365/226

* cited by examiner

*Primary Examiner*—Thong Q Le
(74) *Attorney, Agent, or Firm*—Volpe and Koenig, PC

(57) ABSTRACT

A power-on management circuit for a memory device is provided. The power-on management circuit comprises a first external power-on voltage detector, a second external power-on voltage detector, a delay unit, a logic circuit, an internal power-on voltage detector, a voltage control circuit, a plurality of first electric pumps and a second electric pump. The first external power-on voltage detector has a first voltage threshold, receives a first external voltage, and generates a first control signal when the first external voltage is higher than the first voltage threshold. The second external power-on voltage detector has a second voltage threshold, receives a second external voltage, and generates a second control signal when the second external voltage is higher than the second voltage threshold.

20 Claims, 8 Drawing Sheets

POWER-ON MANAGEMENT CIRCUIT FOR MEMORY

FIELD OF THE INVENTION

The present invention relates to a power-on management circuit, and more particularly to a power-on management circuit for memory devices.

BACKGROUND OF THE INVENTION

The memory usually refers to a form of the semiconductor device for information retention. Specifically, there are two types of memories, namely the volatile memory and the non-volatile memory, based on their capability of data storage and the existence of electrical power. For instance, the volatile memory such as the random access memory (RAM) requires power to maintain the stored information.

The dynamic random access memory (DRAM) is one type of RAM that stores each bit of data in a separate capacitor within an integrated circuit. Since real capacitors leak charge, the stored information eventually fades away unless the capacitor charge is refreshed periodically.

When a DRAM is in power-on status, millions of capacitors in the DRAM are charged from a voltage level of zero to a certain value (say 1.3 volts) simultaneously. At this moment, the DRAM consumes current. Please refer to FIG. 1, which is a time versus current diagram during a power-on period of a DRAM. It can be observed that there is an ultimate value of the current variation, which is called the peak current.

Unfortunately, if the value of the peak current exceeds that of the maximum loading defaulted by the system, the power-on process of the system will fail. To overcome such an issue, there exists a power-on circuit designed for reducing the peak current.

FIG. 2 shows a schematic diagram of a power-on circuit in the prior art. The technical feature for the power-on circuit is to turn on/off those electronic devices in a DRAM sequentially. According to FIG. 2, a power-on circuit 2 includes an external power-on voltage detector 21, an internal power-on voltage detector 22, a voltage control circuit 23, and a plurality of electric pumps 24 for escalating the voltage level. There are four electric pumps 24 in this particular case. Next, a fast power-on process for the conventional DRAM is described below.

When an external voltage A is applied to the external power-on voltage detector 21, the external power-on voltage detector 21 generates a first control signal inite_n having a logical high state if the external voltage A is higher than a first threshold voltage (say 1 volt) defaulted in the external power-on voltage detector 21. The internal power-on voltage detector 22, which is coupled to the external power-on voltage detector, receives the first control signal inite_n and generates a second control signal on_vint having a logical high state, which is operable by the internal circuit. It is to be noted that there is a pre-determined time-delay (about 1 micro second) between the timing of the logical high state for the first control signal inite_n and that of the logical high state for the second control signal on_vint. Subsequently, the voltage control circuit 23, which is coupled to the internal power-on voltage detector 22, receives the second control signal on_vint and generates an enabling signal run_vpp.

During a fast power-on period for DRAM, when the enabling signal run_vpp is escalated to a logical high state, all those electric pumps 24 in the power-on circuit 2 are on. The electric pumps 24 are switching devices, each of which has several capacitors for storing electric power and for producing a higher voltage power source. However, the above-mentioned power-on circuit 2 for reducing the peak current may produce an unexpected amount of the peak current.

There exists a strategy for resolving the issue of peak current due to turning on all the electric pumps simultaneously, which is to turn on one electric pump while keeping others off during a slow power-on period and release the latter afterwards. Such a strategy may avoid the large amount of peak current due to turning on all the electric pumps simultaneously; nevertheless, the process for completing the charging to all the electric pumps takes more than 200 micro seconds which is defined as the minimum time period for the DRAM power-on sequence by JEDEC standards.

Therefore, it is necessary to provide a power-on management circuit for the memory to overcome the drawbacks in the prior art.

SUMMARY OF THE INVENTION

In accordance with one aspect of the present invention, a power-on management circuit for a memory device is provided. The power-on management circuit comprises a first external power-on voltage detector, a second external power-on voltage detector, a delay unit, a logic circuit, an internal power-on voltage detector, a voltage control circuit, a plurality of first electric pumps and a second electric pump. The first external power-on voltage detector has a first voltage threshold, receives a first external voltage, and generates a first control signal when the first external voltage is higher than the first voltage threshold. The second external power-on voltage detector has a second voltage threshold, receives a second external voltage, and generates a second control signal when the second external voltage is higher than the second voltage threshold. The delay unit is coupled to the first external power-on voltage detector, and generates a third control signal by delaying the first control signal for a pre-determined time. The logic circuit is coupled to the second external power-on voltage detector and the delay unit, receives the second control signal and the third control signal, and generates a first enabling signal. The internal power-on voltage detector has an input coupled to the first external power-on voltage detector, receives the first control signal, and generates a fourth control signal based upon the first control signal. The voltage control circuit receives the fourth control signal, and generates a second enabling signal based upon the fourth control signal. The plurality of first electric pumps are coupled to the logic circuit, and activate one of an on and an off actions based upon the first enabling signal. The second electric pump is coupled to the voltage control circuit, and activate one of an on and an off actions based upon the second enabling signal.

Preferably, the voltage control circuit has an input terminal coupled to the first internal power-on voltage detector, and an output terminal coupled to the logic circuit and the second electric pump.

Preferably, the second voltage threshold is larger than the first voltage threshold, and the delay unit is a logic gate.

Preferably, the logic circuit comprises a latch device and a plurality of logic gates electrically connected to the latch device.

Preferably, the latch device performs a data latching, and then the logic gates perform plural logical calculations to generate the first enabling signal.

Preferably, the latch device is one of an SR latch and an $\overline{SR}$ NAND latch.

Preferably, the logic gates comprises a NOT gate, an OR gate and an AND gate.

Preferably, the OR gate has an input terminal receiving a signal indicating a stable voltage supply to perform an OR calculation.

Preferably, when the memory device is in a fast power-on period, the second control signal having a logical high state is generated earlier than the third control signal having a logical high state.

Preferably, when the memory device is in a slow power-on period, the third control signal having a logical high state is generated earlier than the second control signal having a logical high state.

In accordance with another aspect of the present invention, a power-on management circuit for a memory device is provided. The power-on management circuit comprises a first external power-on voltage detector, a second external power-on voltage detector, an internal power-on voltage detector, a logic circuit, a voltage control circuit, a plurality of first electric pumps and a second electric pump. The first external power-on voltage detector has a first voltage threshold, receives a first external voltage, and generates a first control signal when the first external voltage is higher than the first voltage threshold. The second external power-on voltage detector has a second voltage threshold, receives a second external voltage, and generates a second control signal when the second external voltage is higher than the second voltage threshold. The internal power-on voltage detector is coupled to the first external power-on voltage detector, and generates a third control signal based upon the first control signal. The logic circuit is coupled to the second external power-on voltage detector and the first internal power-on voltage detector, receives the second control signal and the third control signal, and generates a first enabling signal. The voltage control circuit receives the third control signal, and generates a second enabling signal based upon the third control signal. The plurality of first electric pumps are coupled to the logic circuit, and activate one of an on and an off actions based upon the first enabling signal. The second electric pump is coupled to the voltage control circuit, and activate one of an on and an off actions based upon the second enabling signal.

Preferably, the voltage control circuit has an input terminal coupled to the logic circuit and the first internal power-on voltage detector, and an output terminal coupled to the logic circuit and the second electric pump.

Preferably, the second voltage threshold is larger than the first voltage threshold.

Preferably, the logic circuit comprises a latch device and a plurality of logic gates electrically connected to the latch device.

Preferably, the latch device performs a data latching, and then the logic gates perform plural logical calculations to generate the first enabling signal.

Preferably, the latch device is one of an SR latch and an $\overline{\text{SR}}$ NAND latch.

Preferably, the logic gates comprises a NOT gate, an OR gate and an AND gate.

Preferably, the OR gate has an input terminal receiving a signal indicating a stable voltage supply to perform an OR calculation.

Preferably, when the memory device is in a fast power-on period, the second control signal having a logical high state is generated earlier than the third control signal having a logical high state.

Preferably, when the memory device is in a slow power-on period, the third control signal having a logical high state is generated earlier than the second control signal having a logical high state.

The above objects and advantages of the present invention will become more readily apparent to those ordinarily skilled in the art after reading the details set forth in the descriptions and drawings that follow, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

To deal with the issue of peak current during the fast power-on period for memory devices such as the DRAM and to manage the slow power-on period within the specification limit per JEDEC requirements, the present invention provides a power-on management circuit for the memory.

Figure 1:
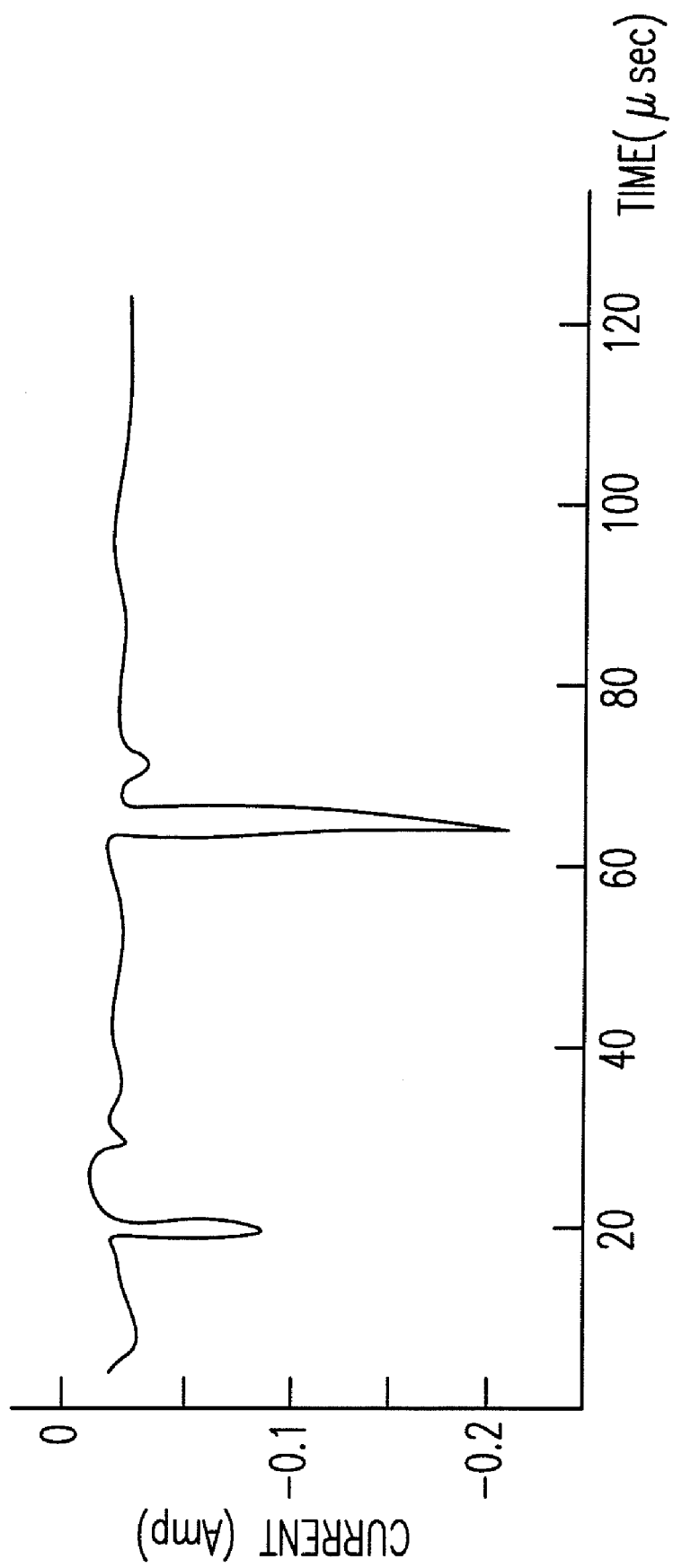
FIG. 1 is a time versus current diagram during a power-on period of a DRAM.
Figure 2:
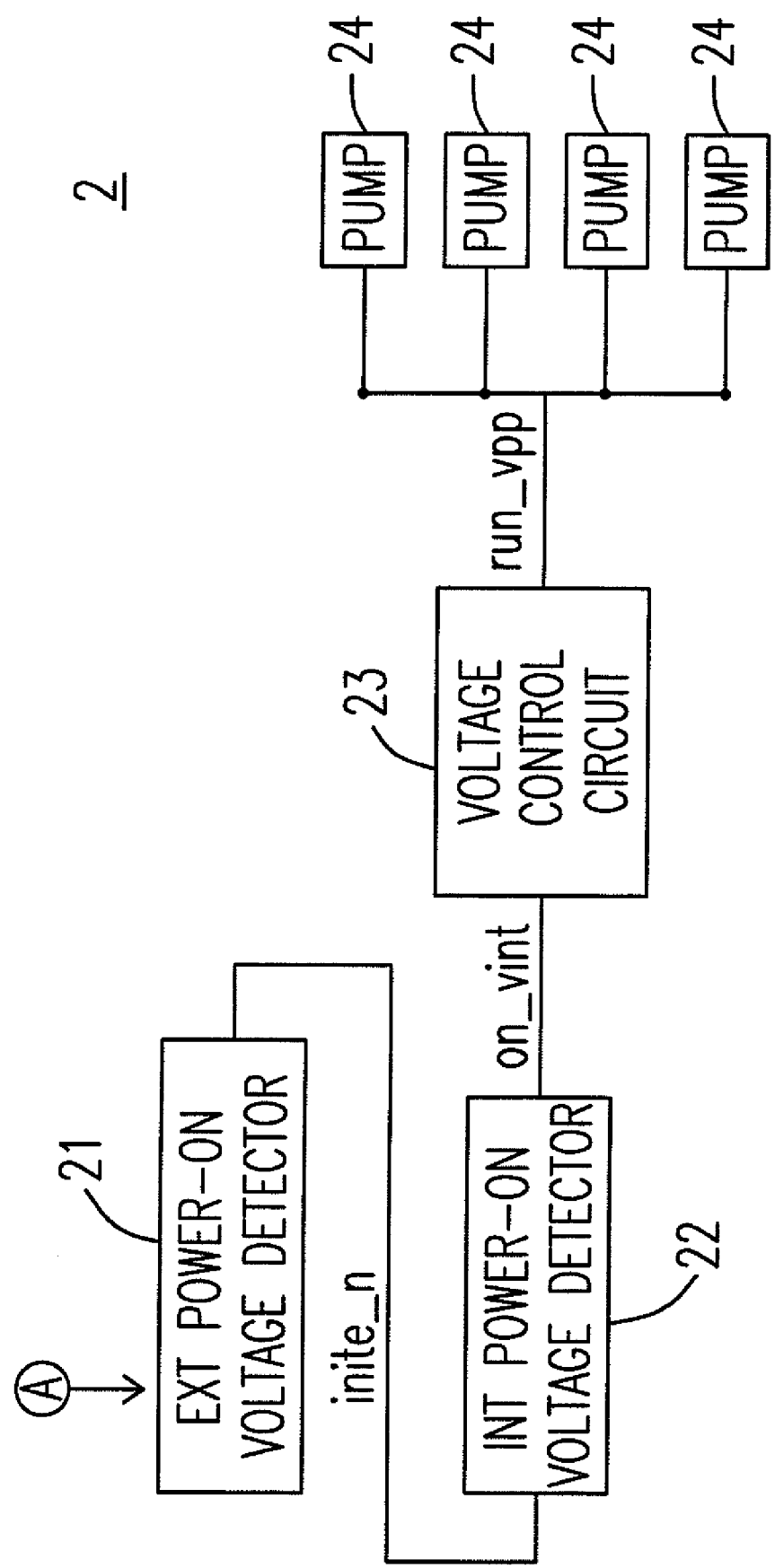
FIG. 2 is a schematic diagram of a power-on circuit for the memory in the prior art.
Figure 3:
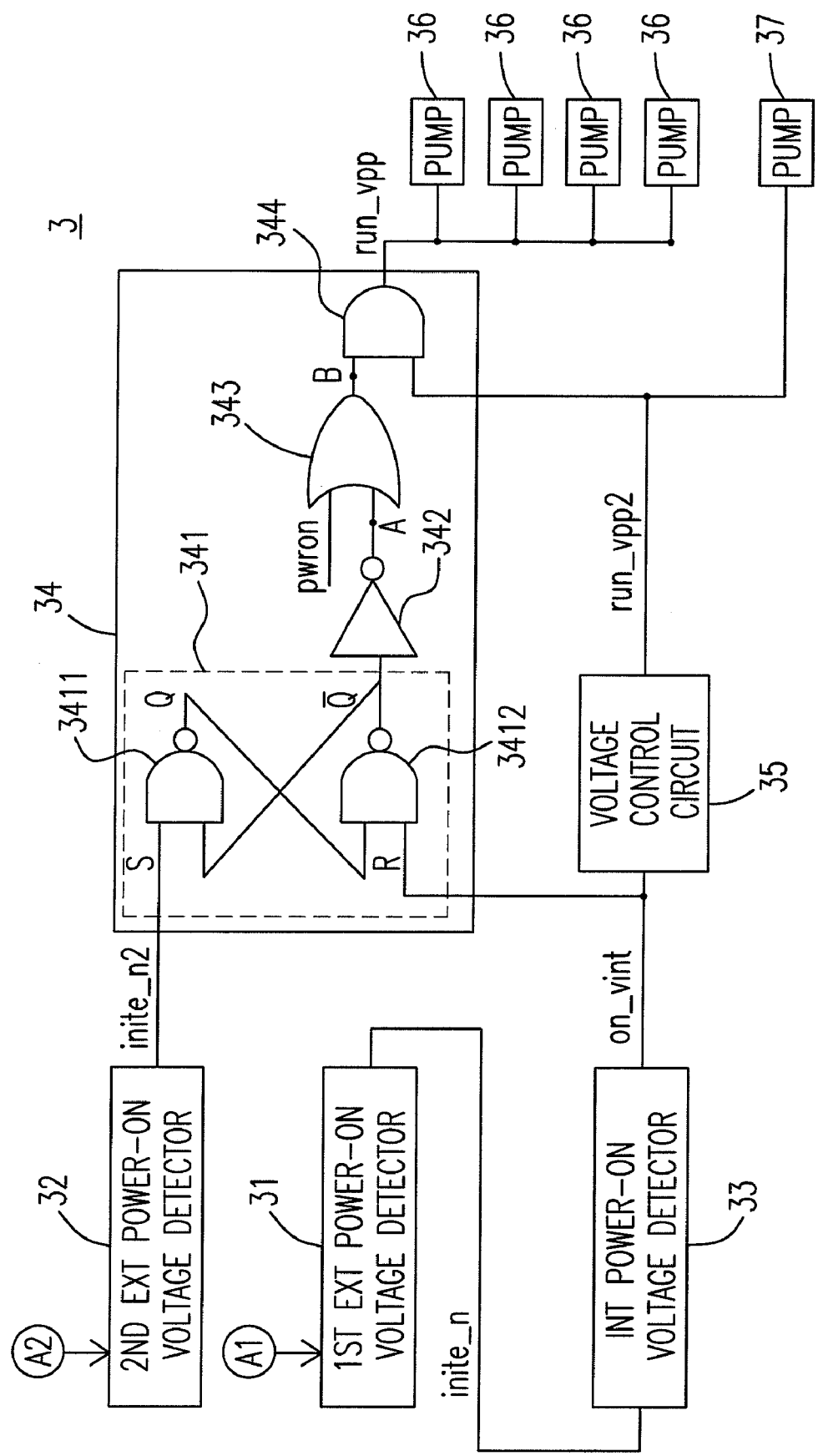
FIG. 3 is a schematic diagram showing the circuit structure of a power-on management circuit, according to a preferred embodiment of the present invention.

Please refer to FIG. 3, which is a schematic diagram showing the circuit structure of a power-on management circuit 3 for the memory according to one preferred embodiment of the present invention. According to FIG. 3, the power-on management circuit 3 comprises a first external power-on voltage detector 31 having a first voltage threshold, a second external power-on voltage detector 32 having a second voltage threshold, an internal power-on voltage detector 33, a logic circuit 34, a voltage control circuit 35, a plurality of first electric pumps 36 and a second electric pump 37. The second voltage threshold is larger than the first voltage threshold.

During a fast power-on period for a DRAM, a first external voltage A1 and a second external voltage A2 of the same amount of voltage are applied to the first external power-on voltage detector 31 and the second external power-on voltage detector 32 respectively. Both the first external power-on voltage detector 31 and the second external power-on voltage detector 32 automatically verify whether the external voltages A1, A2 exceed the voltage thresholds respectively. When the value of the first external voltage A1 exceeds the first voltage threshold, the first external power-on voltage detector 31 generates a first control signal inite_n. Similarly, the second external power-on voltage detector 32 generates a second control signal inite_n2 when the value of the second external voltage A2 exceeds the second voltage threshold. For the value of the second voltage threshold is larger than that of the first voltage threshold, the timing for the second control signal inite_n2 being escalated from a logical low state (considered as "0") to a logical high state (considered as "1") will be later than the timing for the first control signal inite_n being escalated from a logical low state to a logical high state.

Figure 4:
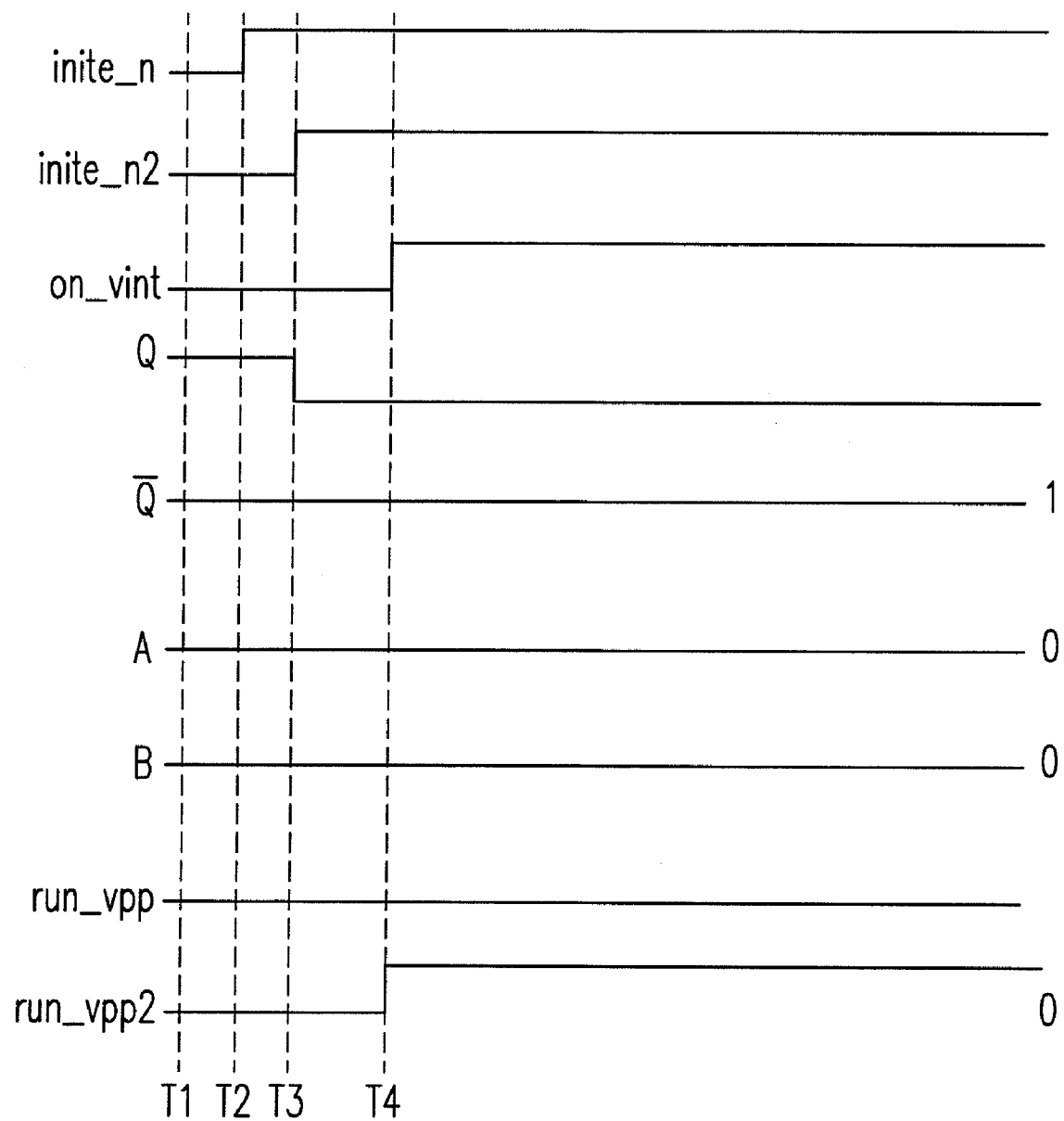
FIG. 4 is a schematic diagram showing the waveform of the signals operated by the power-on management circuit in FIG. 3, during a fast power-on process.

Please refer to FIG. 4, which is a schematic diagram showing the waveform of the signals operated by the power-on management circuit 3 during a fast power-on process. The period from T1 to T4 indicates the overall time span for both the control signals inite_n and inite_n2 being escalated from the logical low state (0) to the logical high state (1).

Referring to FIG. 3 along with FIG. 4, at the time T1, the second control signal inite_n2 at the logical low state (0) is transmitted to a first input terminal S of the logic circuit 34 which is coupled to the second external power-on voltage detector 32. The first control signal inite_n at the logical low state (0) is transmitted to the internal power-on voltage detector 33, which is coupled to the first external power-on voltage detector 31. Based upon the input signal, the internal power-on voltage detector 33 generates a third control signal on_vint at the logical low state (0) and transmits the on_vint to a second input terminal R of the logic circuit 34 and the voltage control circuit 35. Consequently, based upon the third control signal on_vint at the logical low state, the voltage control circuit 35 generates a second enabling signal run_vpp2 at the logical low state (0), and the second enabling signal run_vpp2 is transmitted to the logic circuit 34 and the second electric pump 37.

The logic circuit 34, which receives the second control signal inite_n2 (logical low) and the third control signal on_vint (logical low), comprises a latch device 341 and several logic gates electrically connected to the latch device 341, as shown in FIG. 3. The latch device 341 is one of an SR latch and an $\overline{SR}$ NAND latch. The present embodiment uses the $\overline{SR}$ NAND latch 341 connected with a NOT gate 342, an OR gate 343 and an AND gate 344 for instance. The $\overline{SR}$ NAND latch 341 has a first NAND 3411 and a second NAND 3412 cross-coupled to each other, and two output terminals Q and $\overline{Q}$.

For the second control signal inite_n2 at the logical low state (0) received by the first input terminal S, the first NAND 3411 performs a NAND calculation and outputs a logic value of 1 at the output terminal Q. Meanwhile, for the third control signal on_vint at the logical low state (0) received by the second input terminal R and the logic value of 1 transmitted from the output terminal Q, the second NAND 3412 performs a NAND calculation and outputs a logic value of 1 at the output terminal $\overline{Q}$. For the logic value of 1 transmitted from the output terminal $\overline{Q}$, the NOT gate 342 performs an calculation and outputs a logic value of 0 to a point A. Continually, the logic value of 0 from the point A and a signal pwron indicating a stable voltage supply are both transmitted to the OR gate 343. The signal pwron has a logic value of 0. The OR gate 343 performs an OR calculation and outputs a logic value of 0 to a point B. The logic value of 0 from the point B and the second enabling signal run_vpp_2 at the logical low state (0) are transmitted to the AND gate 344 for an AND calculation, and then the AND gate 344 outputs a first enabling signal run_vpp at the logical low state (0).

Finally, the first enabling signal run_vpp at the logical low state (0) output by the logic circuit 34 causes those first electric pumps 36 to be turned off, and the second enabling signal run_vpp2 at the logical low state (0) output by the voltage control circuit 35 causes the second electric pump 37 to be turned off.

During a fast power-on period T2 to T4 for a DRAM, the logic value of each signal is listed in Table 1, based on the circuit operation set forth above. The plurality of the first electric pumps 36 are activated either on or off, according to the logical state of the first enabling signal run_vpp. The second electric pump 37 are activated either on or off, according to the logical state of the second enabling signal run_vpp2.

TABLE 1

DRAM in fast power-on period (e.g. less than 100 micro second)

| Time | inite_n | inite_n2 | on_vint | Q | $\overline{Q}$ | A | B | run_vpp | run_vpp2 | pwron |
|---|---|---|---|---|---|---|---|---|---|---|
| T1 | 0 | 0 | 0 | 1 | 1 | 0 | 0 | 0 | 0 | 0 |
| T2 | 1 | 0 | 0 | 1 | 1 | 0 | 0 | 0 | 0 | 0 |
| T3 | 1 | 1 | 0 | 0 | 1 | 0 | 0 | 0 | 0 | 0 |
| T4 | 1 | 1 | 1 | 0 | 1 | 0 | 0 | 0 | 1 | 0 |

According to Table 1, the second enabling signal run_vpp2 is at the logical high state after T4, which activates the second electric pump 37 on; the first enabling signal run_vpp is at the logical low state after T4, which activates the first electric pumps 36 off.

Figure 5:
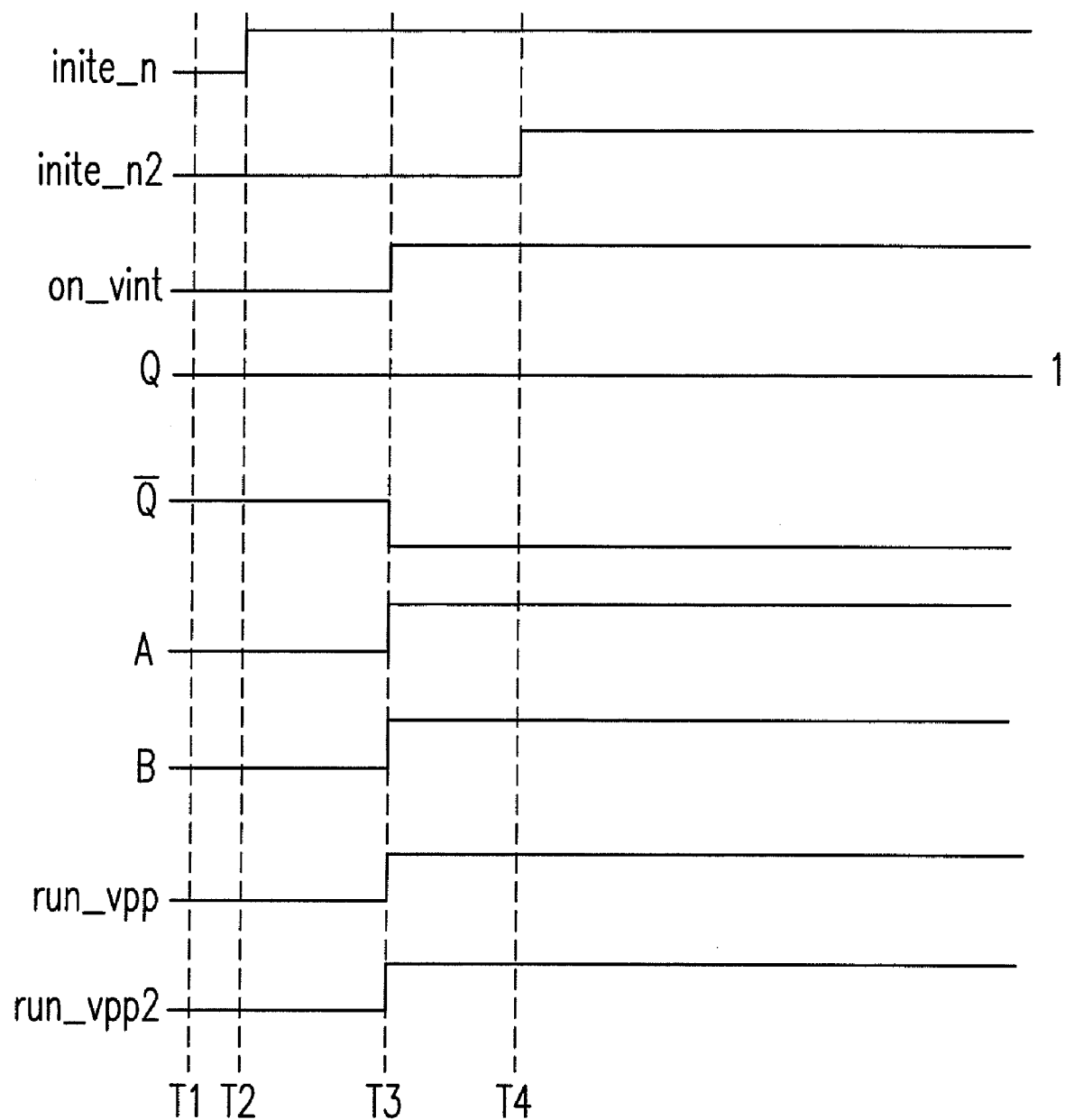
FIG. 5 is a schematic diagram showing the waveform of the signals operated by the power-on management circuit in FIG. 3, during a slow power-on process.

Please refer to FIG. 5, which is a schematic diagram showing the waveform of the signals operated by the power-on management circuit 3 during a slow power-on process. The logic value of each signal during the slow power-on process is listed in Table 2.

TABLE 2

DRAM in slow power-on period (e.g. over 100 micro second)

| Time | inite_n | inite_n2 | on_vint | Q | $\overline{Q}$ | A | B | run_vpp | run_vpp2 | pwron |
|---|---|---|---|---|---|---|---|---|---|---|
| T1 | 0 | 0 | 0 | 1 | 1 | 0 | 0 | 0 | 0 | 0 |
| T2 | 1 | 0 | 0 | 1 | 1 | 0 | 0 | 0 | 0 | 0 |
| T3 | 1 | 0 | 1 | 1 | 0 | 1 | 1 | 1 | 1 | 0 |
| T4 | 1 | 1 | 1 | 1 | 0 | 1 | 1 | 1 | 1 | 0 |

According to Table 2, the first enabling signal run_vpp and the second enabling signal run_vpp2 are both at the logical high state after T3, which activates the first electric pumps 36 and the second electric pump 37 on.

It is to be noted that, according to FIG. 4, the second control signal inite_n2 having a logical high state is generated earlier than the third control signal on_vint having a logical high state when the memory device is in a fast power-on period. According to FIG. 5, the third control signal on_vint having a logical high state is generated earlier than the second control signal inite_n2 having a logical high state when the memory device is in a slow power-on period.

Figure 6:
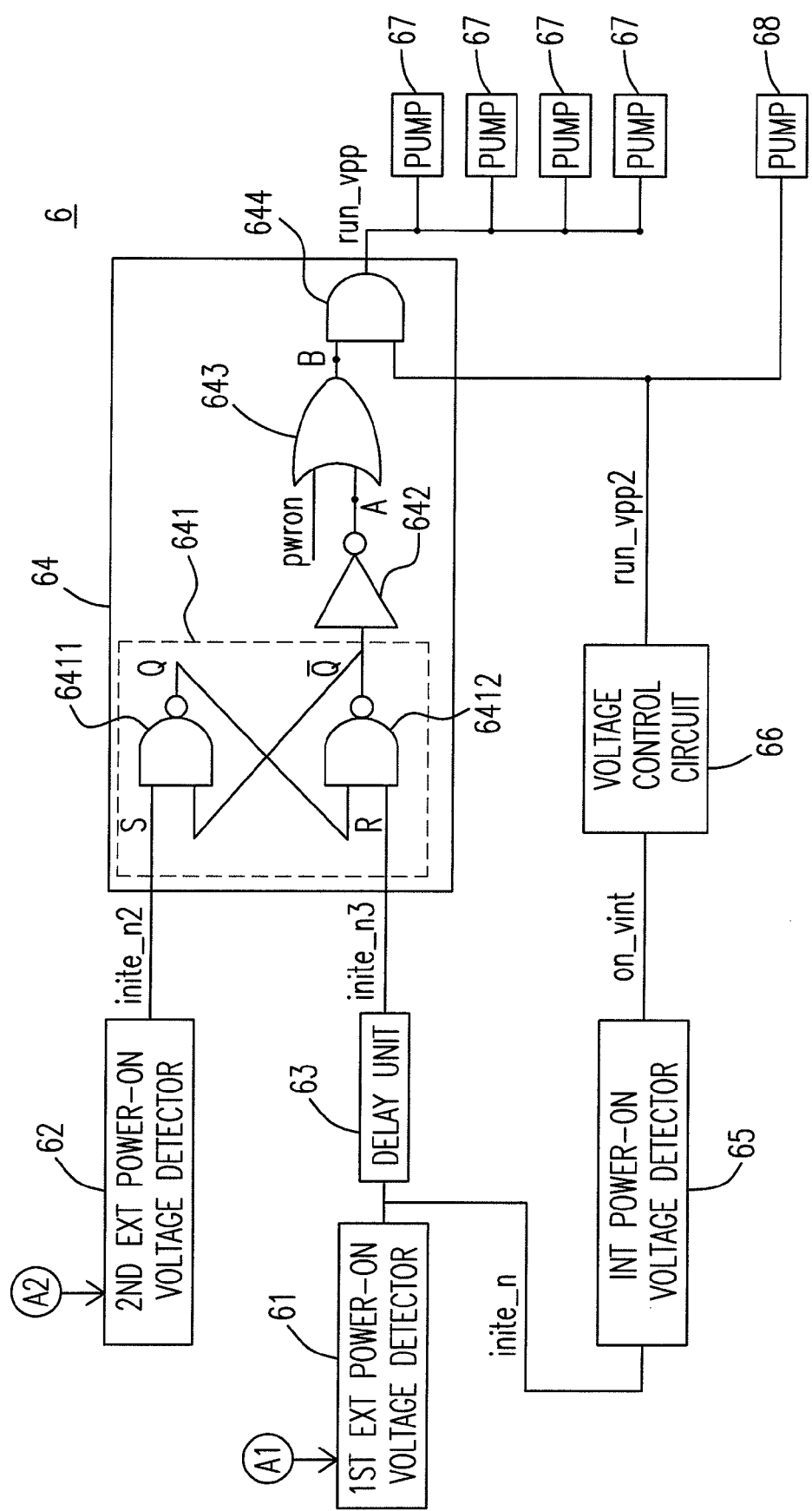
FIG. 6 is a schematic diagram showing the circuit structure of a power-on management circuit, according to another preferred embodiment of the present invention.

In accordance with another aspect of the present invention, a power-on management circuit for a memory device is provided. FIG. 6. is a schematic diagram showing the circuit structure of a power-on management circuit, according to another preferred embodiment of the present invention. Referring to FIG. 6, the power-on management circuit 6 comprises a first external power-on voltage detector 61 having a first voltage threshold, a second external power-on voltage detector 62 having a second voltage threshold, a delay unit 63, a logic circuit 64, an internal power-on voltage detector 65, a voltage control circuit 66, a plurality of first electric pumps 67 and a second electric pump 68. The second voltage threshold is larger than the first voltage threshold.

During a fast power-on period for a DRAM (say less than 100 micro second), a first external voltage A1 and a second external voltage A2 of the same amount of voltage are applied to the first external power-on voltage detector 61 and the second external power-on voltage detector 62 respectively. Both the first external power-on voltage detector 61 and the second external power-on voltage detector 62 automatically verify whether the external voltages A1, A2 exceed the voltage thresholds respectively. When the value of the first external voltage A1 exceeds the first voltage threshold, the first external power-on voltage detector 61 generates a first control signal inite_n. Similarly, the second external power-on voltage detector 62 generates a second control signal inite_n2 when the value of the second external voltage A2 exceeds the second voltage threshold. For the value of the second voltage threshold is larger than that of the first voltage threshold, the timing for the second control signal inite_n2 being escalated from a logical low state (considered as "0") to a logical high state (considered as "1") will be later than the timing for the first control signal inite_n being escalated from a logical low state to a logical high state.

Figure 7:
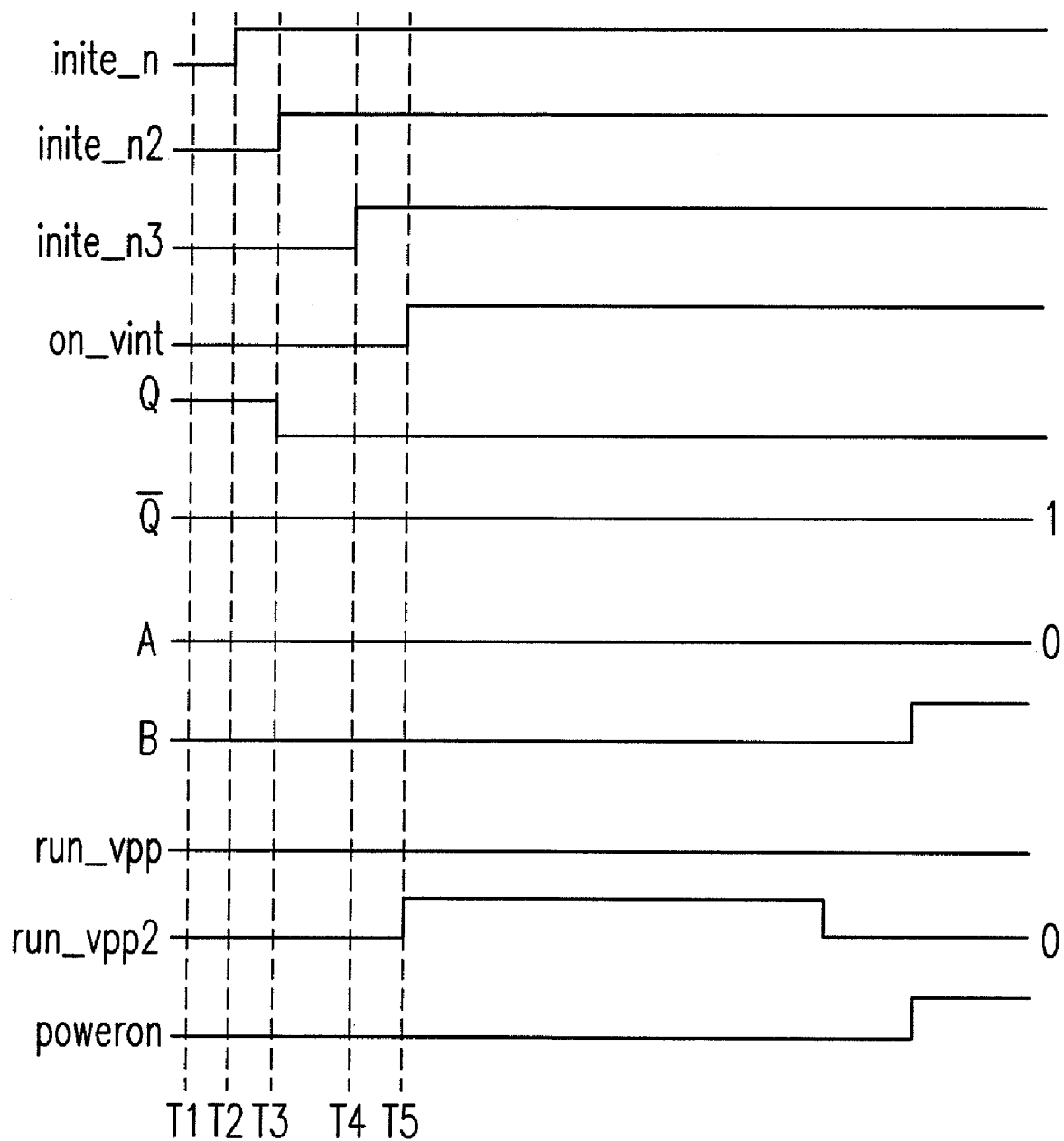
FIG. 7 is a schematic diagram showing the waveform of the signals operated by the power-on management circuit in FIG. 6, during a fast power-on process.

FIG. 7 is a schematic diagram showing the waveform of the signals operated by the power-on management circuit 6 during a fast power-on process. Referring to FIG. 6 along with FIG. 7, at the time T1, a second control signal inite_n2 at the logical low state (0) is transmitted to a first input terminal S of the logic circuit 64 which is coupled to the second external power-on voltage detector 62. The first control signal inite_n at the logical low state (0) is transmitted to the delay unit 63 and the internal power-on voltage detector 65, which are coupled to the first external power-on voltage detector 61. Preferably, the delay unit 63 is one selected from a group of logic gates including an AND gate, an OR gate, a NOT gate, a NAND gate, a NOR gate, an XOR gate and an XNOR gate. By delaying the first control signal inite_n for a pre-determined time, the delay unit 63 generates a third control signal inite_n3 at the logical low state (0) and transmits the inite_n3 to a second input terminal R of the logic circuit 64.

The logic circuit 64, which receives the second control signal inite_n2 (logical low) and the third control signal inite_n3 (logical low), comprises a latch device 641 and several logic gates electrically connected to the latch device 641, as shown in FIG. 6. The latch device 641 is one of an SR latch and an $\overline{SR}$ NAND latch. The present embodiment uses the $\overline{SR}$ NAND latch 641 connected with a NOT gate 642, an OR gate 643 and an AND gate 644 for instance. The $\overline{SR}$ NAND latch 641 has a first NAND 6411 and a second NAND 6412 cross-coupled to each other, and two output terminals Q and $\overline{Q}$. The layout structure as well as the function of the logic circuit 64 in FIG. 6 are identical to those of the logic circuit 34 in FIG. 3. Therefore, the detailed operation process of the logic circuit 64 will not be repeated. Based upon the input signals, the logic circuit 64 generates a first enabling signal run_vpp.

At the time T1, the first control signal inite_n at the logical low state (0) is transmitted to the internal power-on voltage detector 65, which is coupled to the first external power-on voltage detector 61. Based upon the input signal, the internal power-on voltage detector 65 generates a fourth control signal on_vint at the logical low state (0) and transmits the on_vint to the voltage control circuit 66. Consequently, based upon the fourth control signal on_vint at the logical low state, the voltage control circuit 66 generates a second enabling signal run_vpp2 at the logical low state (0) and transmits the second enabling signal run_vpp2 to the second electric pump 68 and the logic circuit 64.

Finally, the first enabling signal run_vpp at the logical low state (0) output by the logic circuit 64 causes those first electric pumps 67 to be turned off, and the second enabling signal run_vpp2 at the logical low state (0) output by the voltage control circuit 66 causes the second electric pump 68 to be turned off.

During a fast power-on period T2 to T5 for a DRAM, the logic value of each signal is listed in Table 3, based on the circuit operation set forth above. The plurality of the first electric pumps 67 are activated either on or off, according to the logical state of the first enabling signal run_vpp. The second electric pump 68 are activated either on or off, according to the logical state of the second enabling signal run_vpp2.

TABLE 3

| | DRAM in fast power-on period (e.g. less than 100 micro second) | | | | | | | | | | |
|---|---|---|---|---|---|---|---|---|---|---|---|
| Time | inite_n | inite_n2 | inite_n3 | on_vint | Q | $\overline{Q}$ | A | B | run_vpp | run_vpp2 | pwron |
| T1 | 0 | 0 | 0 | 0 | 1 | 1 | 0 | 0 | 0 | 0 | 0 |
| T2 | 1 | 0 | 0 | 0 | 1 | 1 | 0 | 0 | 0 | 0 | 0 |
| T3 | 1 | 1 | 0 | 0 | 0 | 1 | 0 | 0 | 0 | 0 | 0 |
| T4 | 1 | 1 | 1 | 0 | 0 | 1 | 0 | 0 | 0 | 0 | 0 |
| T5 | 1 | 1 | 1 | 1 | 0 | 1 | 0 | 0 | 0 | 1 | 0 |

According to Table 3, the second enabling signal run_vpp2 is at the logical high state after T5, which activates the second electric pump 68 on; the first enabling signal run_vpp is at the logical low state after T5, which activates the first electric pumps 67 off.

Figure 8:
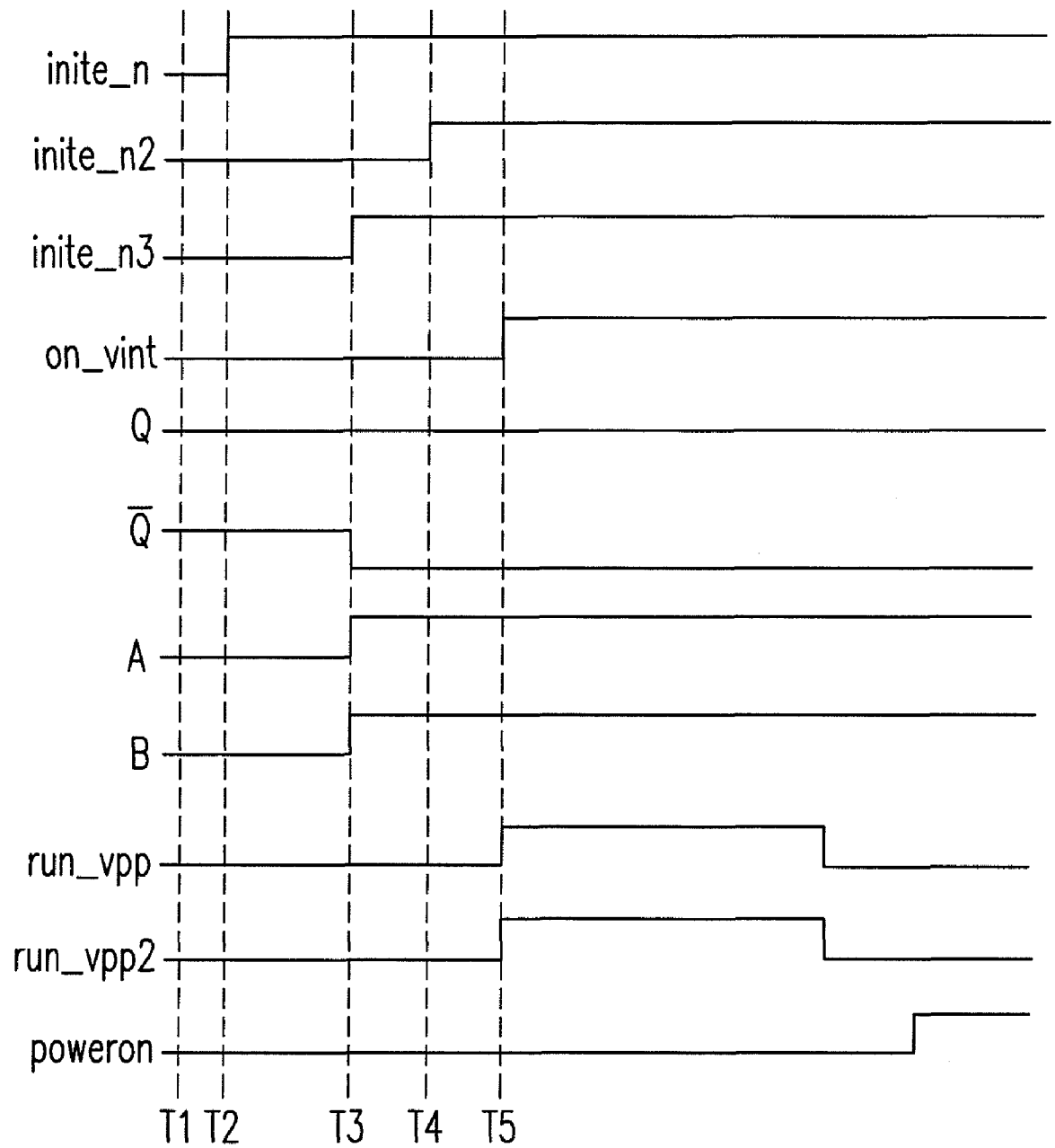
FIG. 8 is a schematic diagram showing the waveform of the signals operated by the power-on management circuit in FIG. 6, during a slow power-on process.

Please refer to FIG. 8, which is a schematic diagram showing the waveform of the signals operated by the power-on management circuit 6 during a slow power-on process. The logic value of each signal during the slow power-on process is listed in Table 4.

TABLE 4

DRAM in slow power-on period (e.g. over 100 micro second)

| Time | inite_n | inite_n2 | inite_n3 | on_vint | Q | $\overline{Q}$ | A | B | run_vpp | run_vpp2 | pwron |
|------|---------|----------|----------|---------|---|----------------|---|---|---------|----------|-------|
| T1 | 0 | 0 | 0 | 0 | 1 | 1 | 0 | 0 | 0 | 0 | 0 |
| T2 | 1 | 0 | 0 | 0 | 1 | 1 | 0 | 0 | 0 | 0 | 0 |
| T3 | 1 | 0 | 1 | 0 | 1 | 0 | 1 | 1 | 0 | 0 | 0 |
| T4 | 1 | 1 | 1 | 0 | 1 | 0 | 1 | 1 | 0 | 0 | 0 |
| T5 | 1 | 1 | 1 | 1 | 1 | 0 | 1 | 1 | 1 | 1 | 0 |

According to Table 4, the first enabling signal run_vpp and the second enabling signal run_vpp2 are both at the logical high state after T5, which activates the first electric pumps 67 and the second electric pump 68 on.

It is to be noted that, according to FIG. 7, the second control signal inite_n2 having a logical high state is generated earlier than the third control signal inite_n3 having a logical high state when the memory device is in a fast power-on period. According to FIG. 8, the third control signal inite_n3 having a logical high state is generated earlier than the second control signal inite_n2 having a logical high state when the memory device is in a slow power-on period.

The specialty of the present invention is, based upon the plurality of electric pumps in the prior art, to distinguish those electric pumps into a plurality of first electric pumps and at least a second electric pump. When a DRAM is in a fast power-on period, the second electric pump is turned on. When a DRAM is in a slow power-on period, both the first and the second electric pumps are turned on.

The power-on management circuit provided by the present invention is not limited to be used for volatile memories such as the DRAM and SRAM. It is also applicable to non-volatile memories such as the ROM, EPROM, PROM, EAROM, EEPROM and flash memory.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims that are to be accorded with the broadest interpretation so as to encompass all such modifications and similar structures.

What is claimed is:

1. A power-on management circuit for a memory device, comprising:
    a first external power-on voltage detector having a first voltage threshold, receiving a first external voltage, and generating a first control signal when the first external voltage is higher than the first voltage threshold;
    a second external power-on voltage detector having a second voltage threshold, receiving a second external voltage, and generating a second control signal when the second external voltage is higher than the second voltage threshold;
    a delay unit coupled to the first external power-on voltage detector, and generating a third control signal by delaying the first control signal for a pre-determined time;
    a logic circuit coupled to the second external power-on voltage detector and the delay unit, receiving the second control signal and the third control signal, and generating a first enabling signal;
    an internal power-on voltage detector having an input coupled to the first external power-on voltage detector, receiving the first control signal, and generating a fourth control signal based upon the first control signal;
    a voltage control circuit receiving the fourth control signal, and generating a second enabling signal based upon the fourth control signal;
    a plurality of first electric pumps coupled to the logic circuit, and activating one of an on and an off actions based upon the first enabling signal; and
    a second electric pump coupled to the voltage control circuit, and activating one of an on and an off actions based upon the second enabling signal.

2. The power-on management circuit as claimed in claim 1, wherein the voltage control circuit has an input terminal coupled to the first internal power-on voltage detector, and an output terminal coupled to the logic circuit and the second electric pump.

3. The power-on management circuit as claimed in claim 1, wherein the second voltage threshold is larger than the first voltage threshold, and the delay unit is a logic gate.

4. The power-on management circuit as claimed in claim 1, wherein the logic circuit comprises a latch device and a plurality of logic gates electrically connected to the latch device.

5. The power-on management circuit as claimed in claim 4, wherein the latch device performs a data latching, and then the logic gates performs plural logical calculations to generate the first enabling signal.

6. The power-on management circuit as claimed in claim 4, wherein the latch device is one of an SR latch and an $\overline{SR}$ NAND latch.

7. The power-on management circuit as claimed in claim 4, wherein the logic gates comprises a NOT gate, an OR gate and an AND gate.

8. The power-on management circuit as claimed in claim 7, wherein the OR gate has an input terminal receiving a signal indicating a stable voltage supply to perform an OR calculation.

9. The power-on management circuit as claimed in claim 1, wherein when the memory device is in a fast power-on period, the second control signal having a logical high state is generated earlier than the third control signal having a logical high state.

10. The power-on management circuit as claimed in claim 1, wherein when the memory device is in a slow power-on period, the third control signal having a logical high state is generated earlier than the second control signal having a logical high state.

11. A power-on management circuit for a memory device, comprising:

a first external power-on voltage detector generating a first control signal;

a second external power-on voltage detector generating a second control signal;

an internal power-on voltage detector coupled to the first external power-on voltage detector, and generating a third control signal based upon the first control signal;

a logic circuit coupled to the second external power-on voltage detector and the first internal power-on voltage detector, receiving the second control signal and the third control signal, and generating a first enabling signal;

a voltage control circuit receiving the third control signal, and generating a second enabling signal based upon the third control signal;

a plurality of first electric pumps coupled to the logic circuit, and activating one of an on and an off actions based upon the first enabling signal; and a second electric pump coupled to the voltage control circuit, and activating one of an on and an off actions based upon the second enabling signal.

12. The power-on management circuit as claimed in claim 11, wherein the first external power-on voltage detector has a first voltage threshold, receives a first external voltage, generates the first control signal when the first external voltage is higher than the first voltage threshold, the second external power-on voltage detector has a second voltage threshold, receives a second external voltage, generates the second control signal when the second external voltage is higher than the second voltage threshold, the voltage control circuit has an input terminal coupled to the logic circuit and the first internal power-on voltage detector, and an output terminal coupled to the logic circuit and the second electric pump.

13. The power-on management circuit as claimed in claim 12, wherein the second voltage threshold is larger than the first voltage threshold.

14. The power-on management circuit as claimed in claim 11, wherein the logic circuit comprises a latch device and a plurality of logic gates electrically connected to the latch device.

15. The power-on management circuit as claimed in claim 14, wherein the latch device performs a data latching, and then the logic gates performs plural logical calculations to generate the first enabling signal.

16. The power-on management circuit as claimed in claim 14, wherein the latch device is one of an SR latch and an $\overline{SR}$ NAND latch.

17. The power-on management circuit as claimed in claim 14, wherein the logic gates comprises a NOT gate, an OR gate, and an AND gate.

18. The power-on management circuit as claimed in claim 17, wherein the OR gate has an input terminal receiving a signal indicating a stable voltage supply to perform an OR calculation.

19. The power-on management circuit as claimed in claim 11, wherein when the memory device is in a fast power-on period, the second control signal having a logical high state is generated earlier than the third control signal having a logical high state.

20. The power-on management circuit as claimed in claim 11, wherein when the memory device is in a slow power-on period, the third control signal having a logical high state is generated earlier than the second control signal having a logical high state.

* * * * *